United States Patent
Tabatowski-Bush et al.

(10) Patent No.: US 11,656,295 B2
(45) Date of Patent: May 23, 2023

(54) BATTERY PACK MEASUREMENT TIMING

(71) Applicant: Ford Global Technologies, LLC, Dearborn, MI (US)

(72) Inventors: Benjamin A. Tabatowski-Bush, Ann Arbor, MI (US); John Paul Gibeau, Canton, MI (US); Baojin Wang, Saline, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 110 days.

(21) Appl. No.: 17/332,384

(22) Filed: May 27, 2021

(65) Prior Publication Data

US 2022/0381847 A1  Dec. 1, 2022

(51) Int. Cl.

| G01R 31/396 | (2019.01) |
|---|---|
| G01R 31/367 | (2019.01) |
| H01M 10/48 | (2006.01) |
| B60L 50/64 | (2019.01) |
| G01R 19/25 | (2006.01) |

(52) U.S. Cl.
CPC ............ *G01R 31/396* (2019.01); *B60L 50/64* (2019.02); *G01R 31/367* (2019.01); *H01M 10/482* (2013.01); *G01R 19/2509* (2013.01); *H01M 2220/20* (2013.01)

(58) Field of Classification Search
CPC ............... G01R 31/396; G01R 31/367; G01R 19/2509; H01M 10/482; H01M 2220/20
See application file for complete search history.

(56) References Cited

U.S. PATENT DOCUMENTS

| 9,555,718 B2 | 1/2017 | Li et al. | |
|---|---|---|---|
| 2012/0326725 A1* | 12/2012 | Sugeno | H02J 7/007192 |
| | | | 324/429 |
| 2016/0072282 A1* | 3/2016 | Kumagai | G01R 31/396 |
| | | | 307/51 |
| 2021/0223327 A1* | 7/2021 | Berger | G01R 31/389 |

FOREIGN PATENT DOCUMENTS

| EP | 2365350 A2 | 9/2011 |
|---|---|---|
| KR | 101481355 B1 | 1/2015 |

OTHER PUBLICATIONS

Kong et al., "Signal synchronization for massive data storage in modular battery management system with controller area network" Applied Energy 197 (2017) 52-62 (Year: 2017).*

* cited by examiner

*Primary Examiner* — John C Kuan
(74) *Attorney, Agent, or Firm* — David B. Kelley; Brooks Kushman P.C.

(57) ABSTRACT

A controller generates a first command for battery array sensors to sense voltages of battery cell arrays of a traction battery, and generates a second command to sample a value of current through the traction battery at a time following the first command that is defined by durations of analog to digital conversion operations of some of the battery array sensors and an analog to digital conversion operation associated with sampling the value.

15 Claims, 2 Drawing Sheets

BATTERY PACK MEASUREMENT TIMING

TECHNICAL FIELD

This disclosure relates to the control of battery packs.

BACKGROUND

Some vehicles may include battery packs that provide power used for propulsion. An electric vehicle, for example, may have a traction battery arranged to provide electric power to an electric machine. The electric machine may then convert this electric power to mechanical power to drive the vehicle.

Battery state information may be useful for implementing battery pack charge and discharge control strategies. Current and voltage data are examples of such battery state information.

SUMMARY

A vehicle power system includes a plurality of battery cell arrays, a plurality of battery array sensors, a current sensor arranged to sense a current through the battery cell arrays, and a controller. Each of the battery array sensors is arranged to sense a voltage of at least some of the battery cells of one of the battery cell arrays. The controller generates a first command for the battery array sensors to sense the voltages and generates a second command to sample a value of the current from the current sensor at a time following the first command that is defined by a time difference between a midpoint of a duration of an analog to digital conversion operation of a first of the battery array sensors and a midpoint of a duration of an analog to digital conversion operation of a last of the battery array sensors.

A method includes generating a first command for battery array sensors to sense voltages of battery cell arrays, and generating a second command to sample a value of current through the battery cell arrays at a time following the first command such that a midpoint of a duration of an analog to digital conversion operation associated with sampling the value occurs at a midpoint of a time difference between a midpoint of a duration of an analog to digital conversion operation of a first of the battery array sensors and a midpoint of a duration of an analog to digital conversion operation of a last of the battery array sensors.

A vehicle includes an electric machine, a traction battery arranged to power the electric machine, and a controller. The controller generates a first command for battery array sensors to sense voltages of battery cell arrays of the traction battery, and generates a second command to sample a value of current through the traction battery at a time following the first command that is defined by durations of analog to digital conversion operations of some of the battery array sensors and an analog to digital conversion operation associated with sampling the value.

DETAILED DESCRIPTION

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Battery monitoring integrated circuits (BMICs) may be used for reading the pack voltage of an electrified vehicle. A challenge for this approach, however, is to be able to synchronize (within 100 microseconds for example) pack voltage and pack current readings: Unsynchronized readings may result in less accurate measurements.

Figure 1:
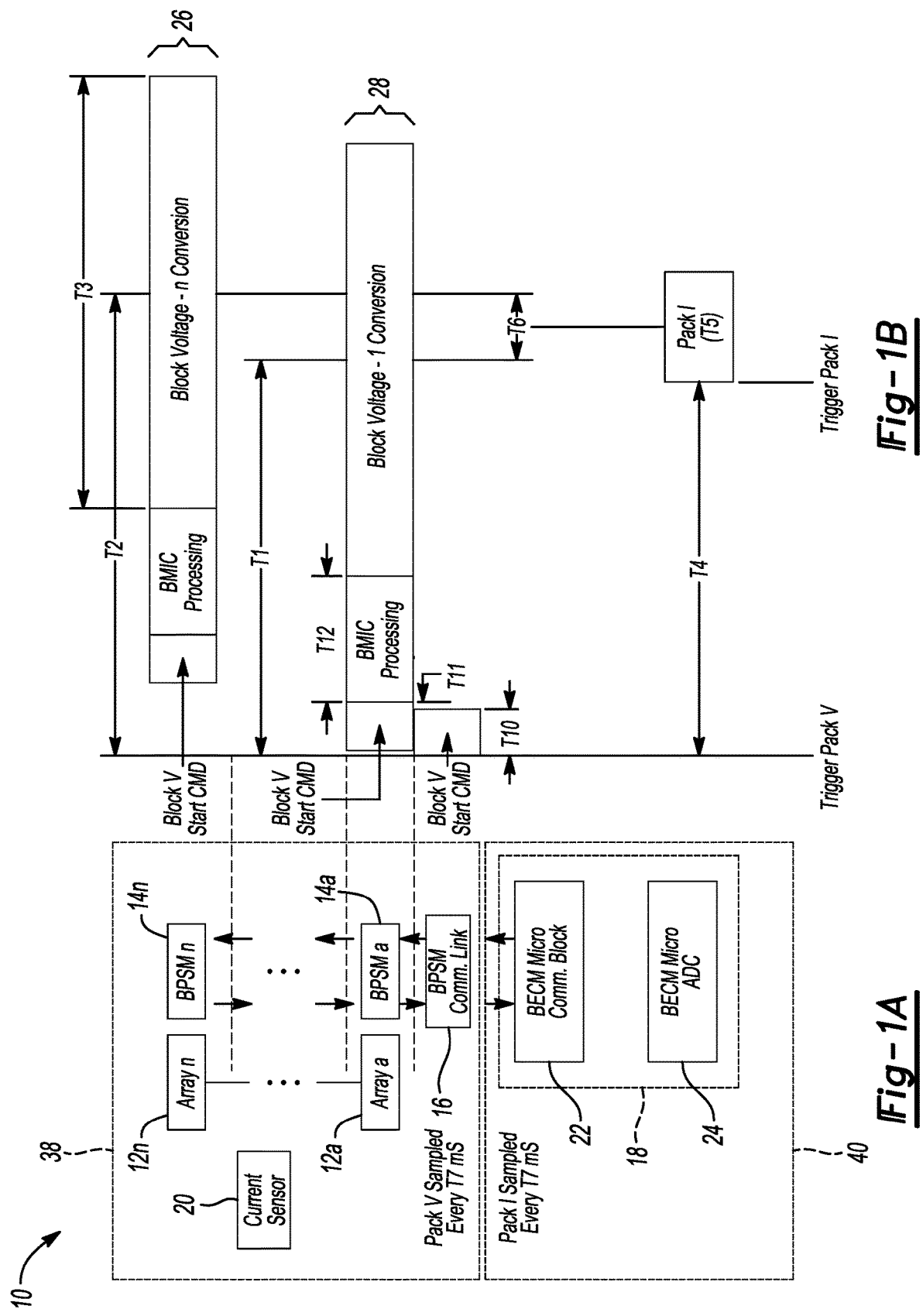
FIG. 1A is a schematic diagram of an automotive power system.
FIG. 1B is a timing diagram of certain measurement operations associated with the automotive power system of FIG. 1A.

Referring to FIG. 1A, a power system 10 for an automotive vehicle includes, among other things, a plurality of battery cell arrays 12a-12n electrically connected in series, a plurality of battery pack sensing modules (BPSMs) 14a-14n each including a battery monitoring integrated circuit, a battery pack sensing module communication link 16, a battery energy control module (BECM) 18, and a current sensor 20. The battery energy control module 18 includes a battery energy control module communication block 22 and an analog to digital converter (ADC) 24.

Each of the battery pack sensing modules 14a-14n is operatively associated with a corresponding one of the battery cell arrays 12a-12n. That is, battery pack sensing module 14a is arranged to perform various sensing operations on at least some of the battery cells of the battery cell array 12a, battery pack sensing module 14n is arranged to perform various sensing operations on at least some of the battery cells of the battery cells array 12n, etc. These sensing operations include voltage measurements of the corresponding battery cell array.

Communication between the battery pack sensing modules 14a-14n and battery energy control module communication block 22 is facilitated by the battery pack sensing module communication link 16. Commands to measure voltage generated by the battery energy control module 18 for the battery pack sensing modules 14a-14n thus pass through the battery pack sensing module communication link 16. The battery pack sensing modules 14a-14n, however, are daisy-chained together, as indicated by arrow, such that commands from the battery energy control module 18 must be propagated sequentially from one of the battery pack sensing modules 14a-14n to another of the battery pack sensing modules 14a-14n (e.g., 14a to 14b to 14c . . . to 14n). Likewise, data collected from any one of the battery pack sensing modules 14a-14n must be propagated the other way in a similar fashion (e.g., 14d to 14c to 14b to 14a) before reaching the battery pack sensing module communication link 16 for delivery to the battery energy control module communication block 22. A same command from the battery energy control module 18 for the battery pack sensing modules 14a-14n may thus arrive at different times.

Analog values from the current sensor 20 are sampled and converted to digital format by the analog to digital converter 24. It may thus be desirable to coordinate the voltage measurements by the battery pack sensing modules 14a-14n, which are added together to obtain a pack voltage recognizing that such measurements may occur at different times given their daisy chained communication links, with the sampling and conversion associated with the current sensor 20 so they are temporally aligned given the circumstances.

Referring to FIGS. 1A and 1B, bar 26 represents timing for the command from the battery energy control module 18 sent to the last battery pack sensing module 14n. It includes three stages: block voltage start command, battery monitoring integrated circuit processing, and block voltage—n conversion. Each of these stages has a predefined duration, which can be determined via simulation or testing. The block voltage start command is a known specific command received on the interface of the battery monitoring integrated circuit of the battery pack sensing module 14n. Battery monitoring integrated circuit processing are the steps taken by the battery monitoring integrated circuit control state machine to arrange operations of the battery monitoring integrated circuit based on received commands. Block voltage—n conversion is the action taken by the analog to digital converter of the battery pack sensing module 14n to convert the analog block voltage to digital format. Bar 28 represents timing for the command from the battery energy control module 18 sent to the first battery pack sensing module 14a. It similarly includes the three stages described previously. The time delay from the command arriving at the first battery pack sensing module 14a until it reaches the last battery pack sensing module 14n is apparent.

T1 is the time from the initial command of the battery energy control module 18 to measure voltage to the midpoint of the analog to digital conversion operation of the first battery monitoring integrated circuit. T2 is the time from the initial command of the battery energy control module 18 to measure voltage to the midpoint of the analog to digital conversion operation of the last battery monitoring integrated circuit. Current and voltage measurement synchronization may be achieved if the midpoint of the conversion of the analog current value to digital is midway between T1 and T2.

In more detail, T1 is the time from the battery energy control module 18 triggering a voltage measurement to the middle of the first block voltage measurement conversion. T2 is the time from the battery energy control module 18 triggering a voltage measurement to the middle of the last battery voltage measurement conversion. T3 is the conversion duration of the block voltage—n conversion stage. (As suggested above, the sum of the battery voltage measurements equals the pack voltage). T4 is the time from the battery energy control module 18 triggering a pack voltage measurement to triggering a pack current measurement. T5 is the analog to digital conversion duration associated with sampling the pack current via the current sensor 20. T6 is the nominal time from the middle of the first block voltage conversion to the middle of the last block voltage conversion (i.e., T2-T1). T6 can also be determined by the number of battery monitoring integrated circuits on the link and T11. T7 is the sampling period. T10 is the time needed for the voltage measurement command to be transferred via the daisy chained communication link. T11 is the propagation time delay from one integrated circuit to the next integrated circuit on the daisy chained communication link. T12 is the battery monitoring integrated circuit processing time before starting the battery voltage measurement conversion.

To synchronize the pack voltage (sampled by battery monitoring integrated circuits of daisy chained battery pack sensing modules) and pack current (sampled by an analog to digital converter), T4 can be determined as $\{(T1+T2)\times 0.5\}-\{T5\times 0.5\}$, such that the pack current and the pack voltage can be aligned in the middle of both conversions.

FIG. 1B only shows one measurement cycle. This cycle, however, may repeat at a sampling rate of 1/T7.

Figure 2:
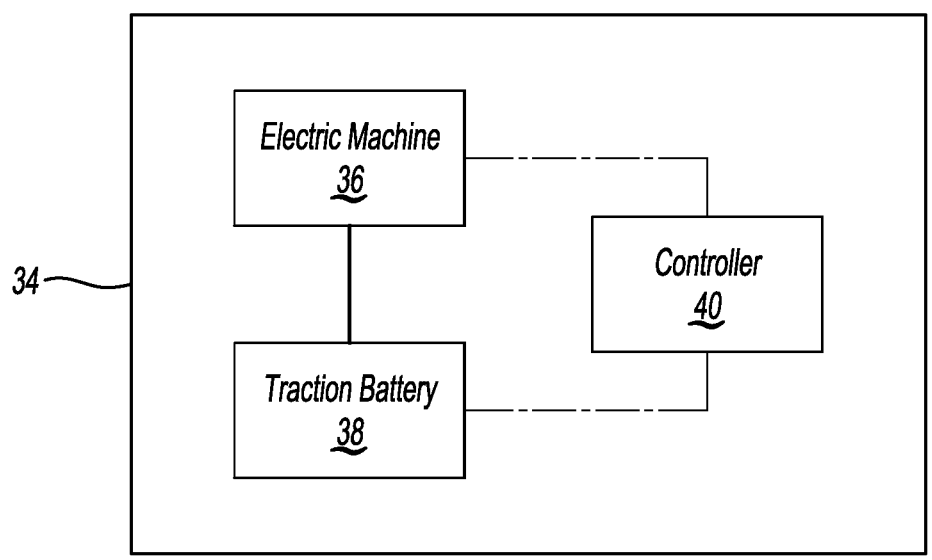
FIG. 2 is a schematic diagram of a vehicle.

Referring to FIG. 2, an automotive vehicle 34 includes an electric machine 36, traction battery 38, and controller 40. The electric machine 36 is arranged to convert electric power from the traction battery 38 to mechanical power to drive wheels of the vehicle 34. The controller 40 is in communication with and/or exerts control over the electric machine 36 and traction battery 38.

Voltage and current measurements of the traction battery 38 may be used by the controller 40, for example, to regulate charging and discharging of the traction battery 38. The controller 40 may prevent charge current to the traction battery 38 from exceeding a predefined threshold based on the measurements. The controller 40 may also prevent the traction battery 38 from further discharge once the voltage of the traction battery 38 achieves a certain lower limit value, etc.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. "Controller," for example, also contemplates "controllers."

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to, cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle power system comprising:
   a plurality of battery cell arrays;
   a plurality of battery array sensors, each of the battery array sensors arranged to sense a voltage of at least some of the battery cells of one of the battery cell arrays;
   a current sensor arranged to sense a current through the battery cell arrays; and
   a controller programmed to generate a first command for the battery array sensors to sense the voltages and to generate a second command to sample a value of the current from the current sensor at a time following the first command that is defined by a time difference between a midpoint of a duration of an analog to digital conversion operation of a first of the battery array sensors and a midpoint of a duration of an analog to digital conversion operation of a last of the battery array sensors.

2. The vehicle power system of claim 1, wherein the time following the first command is further defined by a duration of an analog to digital conversion operation associated with sampling the value.

3. The vehicle power system of claim 2, wherein the time following the first command is such that a midpoint of the duration of the analog to digital conversion operation associated with sampling the value occurs at a midpoint of the time difference.

4. The vehicle power system of claim 2, wherein the time following the first command is equal to a difference between (i) a sum of one half of the time difference and a time from the first command being generated to the midpoint of the duration of the analog to digital conversion operation of the first of the battery array sensors and (ii) one half of the duration of the analog to digital conversion operation associated with sampling the value.

5. The vehicle power system of claim 1, wherein the battery array sensors are interconnected via a daisy chained communication link.

6. The vehicle power system of claim 1, wherein the battery cell arrays form a traction battery.

7. The vehicle power system of claim 6, wherein the traction battery is arranged to provide power to an electric machine.

8. A method for a vehicle power system comprising:
generating a first command for battery array sensors to sense voltages of battery cell arrays; and
generating a second command to sample a value of current through the battery cell arrays at a time following the first command such that a midpoint of a duration of an analog to digital conversion operation associated with sampling the value occurs at a midpoint of a time difference between a midpoint of a duration of an analog to digital conversion operation of a first of the battery array sensors and a midpoint of a duration of an analog to digital conversion operation of a last of the battery array sensors.

9. The method of claim 8, wherein the time following the first command is equal to a difference between (i) a sum of one half of the time difference and a time from the generating the first command to the midpoint of the duration of the analog to digital conversion operation of the first of the battery array sensors and (ii) one half the duration of the analog to digital conversion operation associated with sampling the value.

10. The method of claim 8 further comprising propagating the first command to each of the battery array sensors via a daisy chained communication link.

11. The method of claim 8, wherein the battery cell arrays form a traction battery.

12. A vehicle comprising;
an electric machine;
a traction battery arranged to power the electric machine; and
a controller programmed to
generate a first command for battery array sensors to sense voltages of battery cell arrays of the traction battery; and
generate a second command to sample a value of current through the traction battery at a time following the first command that is defined by durations of analog to digital conversion operations of some of the battery array sensors and an analog to digital conversion operation associated with sampling the value.

13. The vehicle of claim 12, wherein the time following the first command is such that a midpoint of the duration of the analog to digital conversion operation associated with sampling the value occurs at a midpoint of a time difference between a midpoint of the duration of the analog to digital conversion operation of a first of the battery array sensors and a midpoint of the duration of the analog to digital conversion operation of a last of the battery array sensors.

14. The vehicle of claim 13, wherein the time following the first command is equal to a difference between (i) a sum of one half of the time difference and a time from the first command being generated to the midpoint of the duration of the analog to digital conversion operation of the first of the battery array sensors and (ii) one half of the duration of the analog to digital conversion operation associated with sampling the value.

15. The vehicle of claim 13, wherein the battery array sensors are interconnected via a daisy chained communication link.

* * * * *